(12) United States Patent
Blom et al.

(10) Patent No.: US 6,903,558 B1
(45) Date of Patent: Jun. 7, 2005

(54) DIGITIZING OHMMETER SYSTEM

(75) Inventors: Eric D. Blom, Wakefield, MA (US);
Peter R. Holloway, Groveland, MA (US); Jun Wan, Haverhill, MA (US);
Stuart H. Urie, Milford, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 106 days.

(21) Appl. No.: 10/423,355

(22) Filed: Apr. 25, 2003

(51) Int. Cl.[7] .................................................. G01R 1/38
(52) U.S. Cl. ...................................................... 324/712
(58) Field of Search ................................ 324/134, 114, 324/99 D, 74, 723, 714, 435, 158.1, 705, 691, 707, 710, 711, 712

(56) References Cited

U.S. PATENT DOCUMENTS

| | | | |
|---|---|---|---|
| 4,104,578 A | * 8/1978 | Thuot | 324/421 |
| 4,636,715 A | * 1/1987 | Borkowicz | 324/718 |
| 5,564,831 A | 10/1996 | Bashark | 374/141 |
| 5,655,305 A | 8/1997 | Fletcher | 374/170 |
| 5,744,973 A | 4/1998 | Bird | 324/707 |
| 6,309,099 B1 | 10/2001 | Chang | 374/183 |
| 6,320,512 B1 | 11/2001 | Nicholson et al. | 340/588 |

OTHER PUBLICATIONS

Maxim MAX6682 Thermistor–to–Digital Converter data sheet, 19–2219; Rev. 0: 2/02, pp. 1–8.

* cited by examiner

*Primary Examiner*—Evan Pert
*Assistant Examiner*—Trung Q. Nguyen
(74) *Attorney, Agent, or Firm*—Patent Law Group LLP; Carmen C. Cook

(57) ABSTRACT

A digitizing ohmmeter system for providing a digital resistance measurement includes a current source for providing an excitation current to an impedance-varying input sensor and an ADC circuit including a charge-balancing modulator and a digital post processing circuit. The system utilizes synchronous AC excitation of the input sensor and an AC coupled analog-to-digital converter input. The digitizing ohmmeter system also implements correlated double sampling for noise cancellation to provide low noise and highly accurate analog-to-digital conversions. The ADC circuit includes a reference signal generator generating a resistance reference signal by time-sharing the excitation current with the input sensor. The digitizing ohmmeter system thereby realizes fully ratiometric operation such that neither a precise current source nor a precise voltage source is required for accurate resistance measurements.

18 Claims, 5 Drawing Sheets

DIGITIZING OHMMETER SYSTEM

CROSS-REFERENCE TO RELATED APPLICATIONS

This application is related to the following commonly assigned U.S. patent applications: U.S. patent application Ser. No. 10/401,835, entitled "Low Noise Correlated Double Sampling Modulation System," of Peter R. Holloway et al., filed Mar. 27, 2003; and U.S. patent application Ser. No. 10/402,080, entitled "A Constant $R_{ON}$ Switch Circuit with Low Distortion and Reduction of Pedestal Errors," of Peter R. Holloway, filed Mar. 27, 2003. The aforementioned patent applications are incorporated herein by reference in their entireties.

FIELD OF THE INVENTION

The invention relates to a resistance measurement system for measuring the resistance of a sensor and converting the measurement to a digital number. In particular, the invention relates to a high precision digitizing resistance measurement system which does not require a high precision reference current or voltage.

DETAILED DESCRIPTION OF THE PREFERRED EMBODIMENTS

Figure 1:
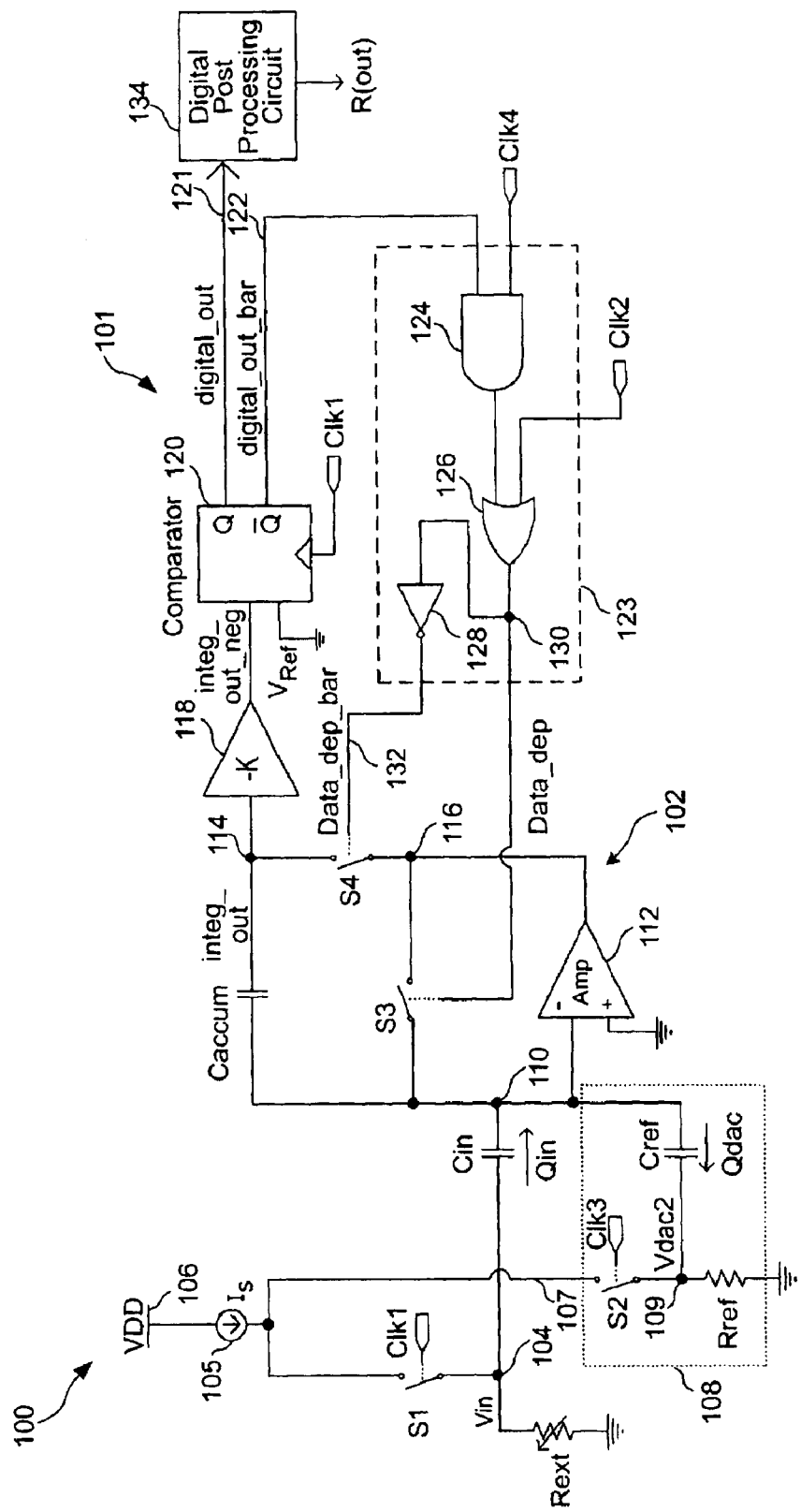
FIG. 1 is a schematic diagram of a digitizing ohmmeter system according to one embodiment of the present invention.

In accordance with the principles of the present invention, a digitizing ohmmeter system of the present invention operates to measure the resistance of an input sensor and convert the resistance measurement to a digital number. The digitizing ohmmeter system includes a charge balancing analog-to-digital converter (ADC) and a synchronous AC excitation source. In one embodiment, the ADC circuit of the digitizing ohmmeter system utilizes a low noise, charge balancing modulation system where the input and reference signals are AC coupled to the ADC circuit. In another embodiment, the input signal is AC coupled while the reference signal is obtained by gating a continuous time current for a precise, short period of time. In either embodiment, the digitizing ohmmeter system can provide very accurate resistance measurements because the thermal noise source associated with the use of switched capacitor circuits in conventional ADC circuits, commonly referred to as kT/C noise which appears at the input and reference signal input terminals, is eliminated. The modulation system of the ADC circuit also implements correlated double sampling at the ADC inputs for canceling amplifier 1/f noise and dc offset voltage and dc offset voltage drift which may be present at the ADC circuit. As a result, a low noise and highly accurate digitizing ohmmeter system is realized where resistance measurements of a very high resolution (up to 16 bits) can be attained.

The system and method of the present invention can be applied to the indirect measurement of many different types of quantities by choosing an input sensor whose resistance changes in response to the stimulus of interest. For example, temperature can be measured by choosing a resistive thermal device or thermistor as the input sensor and pressure can be measured by choosing a piezoresistive pressure sensor element.

A particular advantage of the digitizing ohmmeter system of the present invention is that unlike conventional resistance measurement systems, a precise current source or a precise voltage source is not needed to provide accurate resistance measurements. In one embodiment of the digitizing ohmmeter system of the present invention, an unknown resistance to be measured is effectively compared to a stable reference resistor to determine the value of the unknown resistance. Alternately, the digitizing ohmmeter system of the present invention can be implemented without using a stable reference resistor. Instead, a stable clock frequency is used to apply a not-necessarily precise reference current $I_s$ for a predetermined, short time interval to generate a reference charge packet which reference charge packet is then used to balance against the input charge packet to determine the resistance value to be measured.

In accordance with the present invention, a current source provides a not-necessarily-precise excitation current $I_s$, which is used, in a time interleaved manner, for both sensor excitation and reference signal generation. The system optionally utilizes a one-time calibration to determine small gain and offset trim values which trim values are applied to adjust the absolute accuracy of measurements. When calibration is performed for the digitizing ohmmeter system of the present invention in which a reference resistor is used, the reference resistor is only required to maintain its stability, and does not need to be of a precise value. When calibration is performed for the digitizing ohmmeter system of the present invention in which a clock frequency is used to generate the reference signal, the clock frequency is only required to be stable and is not required to be exact in frequency. In this manner, the digitizing ohmmeter system of the present invention provides highly accurate resistance measurements without requiring a precision current or voltage source.

In the present invention, the not-necessarily-precise excitation current $I_s$ used to excite the input sensor to produce a step voltage change across the sensor. That step voltage change is AC coupled to the ADC circuit as the analog input signal. The AC coupling time constant is chosen to be much, much faster than the excitation pulse width so that the AC coupling capacitor converts the voltage change to an exponentially decaying input charge flow. The input charge flow decays to nearly zero before the excitation is modified. The cumulative AC coupled charge flow defines an input charge packet which charge packet is applied to the charge balancing modulation system to generate a digital output value.

When the digitizing ohmmeter system of the present invention is operated over a number of sampling cycles, a series of voltage steps is generated at the input sensor. The series of voltage steps are converted into a series of input charge packets at the input to the ADC circuit. The charge balancing modulation system of the ADC circuit balances the series of input charge packets with a series of reference charge packets to provide a 1-bit data stream as the output signal. When the 1-bit data stream is digitally accumulated by the digital post processing circuitry, a multi-bit digital number indicative of the resistance measured by the system is provided. For the charge balancing ADC circuit employed in the digitizing ohmmeter system of the present invention, the ones density of the 1-bit data stream generated by the modulation system is the ratio of the ADC input charge to the fullscale reference charge over the measured time interval. Because the input charge is directly proportional to the resistance at the input excitation, the ones density of the 1-bit data stream is also the ratio of the input resistance to be measured to the fullscale reference resistance value.

In accordance with the present invention, the digitizing ohmmeter system utilizes an ADC circuit whose fullscale range is determined by the application of the not-necessarily-precise excitation current to a reference signal generator. Thus, the same excitation current $I_s$ time shared between the input sensor and the reference signal generator. In this manner, the digitizing ohmmeter system of the present invention realizes full ratiometric operation in which slow changes or errors in the excitation current will affect both the input signal and the reference signal equally. As a result, the digitizing ohmmeter system of the present invention does not require a precision current or voltage reference to obtain highly accurate resistance measurements.

System Overview

FIG. 1 is a schematic diagram of a digitizing ohmmeter system according to one embodiment of the present invention. Generally, digitizing ohmmeter system 100 (hereinafter "system 100") includes an excitation source 105 for providing a switched excitation current $I_s$ and an ADC circuit for sampling the input signal and digitizing the input signal to provide a digital resistance output signal. The excitation source is time shared by an input sensor (denoted by resistor $R_{ext}$) and a reference signal generator 108. The ADC circuit includes a charge-balancing modulator 101 and digital post processing circuit 134. Modulator 101 of the ADC circuit of system 100 includes an integrator 102 and a reference signal generator 108 for generating a resistance reference signal in the form of a periodic reference charge packet. This reference charge packet which periodically flows every period of time T is also referred to as the fullscale reference current $I_{ref}=Q_{dac}/T$.

Referring to FIG. 1, digitizing ohmmeter system 100 is configured to sample and digitize an analog input signal generated by an impedance-varying input sensor in response to its stimulus. In the present embodiment, the impedance-varying input sensor is denoted by a variable resistor $R_{ext}$. Resistor $R_{ext}$ is typically an input sensor external to the integrated circuit in which system 100 is formed. In general, system 100 can operate to measure an input sensor's response to the intended stimulus which response corresponds to a change in the resistive or the "real" portion of the sensor's impedance.

The analog input signal to system 100 is an input voltage step Vin indicative of the resistance of resistor $R_{ext}$. Input voltage step Vin is generated by the switched excitation current $I_s$ flowing through resistor $R_{ext}$. The analog input signal to system 100 can also be expressed as an input current $I_{in}$ corresponding to the AC coupled periodic input voltage step Vin. Specifically, the input voltage step Vin generates an input charge packet Qin at an input node 104 as a result of the AC coupling of voltage step Vin to the ADC circuit. The input current $I_{in}$ flowing through capacitor $C_{in}$ is given by the magnitude of the periodic input charge packet Qin divided by the sample period. The operational principles of the digitizing ohmmeter system of the present invention will be further described below in the Operation Theory section.

Digitizing ohmmeter system 100 incorporates reference signal generator 108 to provide a fullscale resistance reference signal for the ADC circuit. In the embodiment shown in FIG. 1, system 100 includes a reference resistor $R_{ref}$ coupled to receive the switched excitation current $I_s$. A voltage Vdac is generated at a node 109 as a result of the application of current $I_s$ for a fixed sample time. Voltage Vdac is AC coupled to the ADC circuit through a capacitor Cref. As a result, a reference charge packet Qdac indicative of the voltage step at voltage Vdac is generated. The fullscale reference current $I_{ref}$ generated at resistor $R_{ref}$ is given by the magnitude of the periodic reference charge packet Qdac divided by the sample period. As will be described in more detail below, in other embodiments, the reference signal generator of digitizing ohmmeter system 100 can be implemented without the use of a reference resistor. In alternate embodiment, excitation current $I_s$ can be coupled to node 109 for a short, precise amount of time to generate the reference charge packet Qdac, as will be explained in more detail below.

Digitizing ohmmeter system 100 employs synchronous AC excitation of the input sensor (resistor $R_{ext}$). Thus, input voltage step Vin is generated and sampled at predetermined, fixed time intervals synchronous with the operation of integrator 102 of the ADC circuit of system 100. Referring to FIG. 1, the excitation source of system 100 includes current source 105 providing excitation current $I_s$ to the input sensor (resistor $R_{ext}$) at node 104. Specifically, current source 105 is connected to resistor $R_{ext}$ through a switch S1. Switch S1 is controlled by a clock signal Clk1. Thus, depending on the switching action of switch S1, resistor $R_{ext}$ is either driven by current $I_s$ or no current at all. The input voltage step Vin is generated as a result of the application of the switched excitation current $I_s$ to resistor $R_{ext}$.

Current source 105 is also connected to resistor $R_{ref}$ at node 109 through a switch S2. Switch S2 is controlled by a clock signal Clk3. Thus, depending on the switching action of switch S2, resistor $R_{ref}$ is either driven by current $I_s$ or no current at all. The voltage step Vdac is generated as a result of the application of the switched excitation current $I_s$ to resistor $R_{ref}$.

As discussed above, the excitation source of system 100 is time-shared between the input sensor and the reference signal generator. Thus, the system can realize a fully ratiometric mode of operation. That is, any slow change in the shared excitation current $I_s$ will affect equally the magnitude of the input voltage step Vin and the magnitude of voltage step Vdac used to generate the ADC reference signal. The system output is equivalent to the ratio of the amplitudes of the voltage step Vin to the voltage step Vdac. If the amplitude of both voltage Vin and voltage Vdac change in equal proportion, the ratio will remain unchanged. Hence, slow perturbations to the excitation current $I_s$, such as drift in the amplitude of current source or 1/f noise, are rejected before they degrade the digital bit decisions made in the ADC circuit. Thus, current source $I_s$ does not need to be of precise amplitude nor of low or known temperature sensitivity.

In the present embodiment, current source 105 is coupled between the VDD supply voltage node 106 and the current input node 107. Current source 105 can be implemented as any conventional current source and does not have to generate a very precise output current $I_s$. The value of excitation current $I_s$ needs only to remain within a range defined by some minimum related to the residual noise and dc offset error of the modulator and below a maximum value above which clipping of the analog signal at the integrator output would begin to occur.

When current source 105 is switched through switch S1 to excite the unknown resistor Rext at input node 104, the analog input voltage step Vin generated at resistor $R_{ext}$ is coupled to modulator 101 of the ADC circuit of system 100 to be sampled and digitized. In the present embodiment, modulator 101 is implemented as a charge balancing modulation system described in aforementioned copending and commonly assigned U.S. patent application Ser. No. 10/401,835, entitled "Low Noise Correlated Double Sampling Modulation System," of Peter R. Holloway et al. The operation method and theory of modulator 101 are described in detail in the aforementioned patent application and will be repeated here only as necessary to explain the operation of digitizing ohmmeter system 100.

Modulator 101 of digitizing ohmmeter system 100 is a wholly AC coupled system. In the present embodiment, the step input voltage Vin and the reference voltage Vdac are AC coupled through their respective input capacitors to the ADC circuit. This form of true AC coupling does not require the switching of either end of the input capacitor. Therefore, switched capacitor noise associated with the use of conventional switched capacitor techniques is eliminated entirely and system 100 can realize very low noise operation.

When AC coupling is used, only changes in the input voltage or the reference voltage are measured and provided to their respective nodes in the ADC circuit. By virtue of using AC coupling of the input voltage signal, the DC voltage level at input node Vin is irrelevant to the operation of system 100. Thus, the digitizing ohmmeter system of the present invention can be advantageously applied to measure with great precision the small signal $\Delta V_{in}$ (the change in voltage Vin), even when $\Delta V_{in}$ is superimposed upon a much larger DC voltage. Thus, input sensor $R_{ext}$ need not be connected to ground, but may be connected to a low impedance source at some DC potential, provided that the maximum voltage at Vin does not rise above the voltage compliance range of current source $I_s$. This type of precision resistance measurement, accurate even in the presence of a slowly varying sensor DC offset voltage, cannot be readily achieved in conventional resistance measurement systems where DC coupled modulators are used.

Referring to FIG. 1, modulator 101 includes an integrator 102 for receiving step input voltage Vin on node 104 and integrating the charge associated with the step change in voltage Vin. In the present embodiment, integrator 102 of modulator 101 is formed by an input capacitor Cin, an operational amplifier 112 and an accumulation capacitor Caccum. Input capacitor cin is coupled between input node 104 and a node 110 which is the inverting input terminal of amplifier 112. The non-inverting input terminal of amplifier 112 is connected to the ground potential. A switch S3, controlled by a data dependent (Data_dep) signal, is connected between the inverting input terminal (node 110) and the output terminal (node 116) of amplifier 112. When switch S3 is closed, a short-circuited negative feedback loop is formed around amplifier 112 and integrator 102 is in an inactive mode.

When step input voltage Vin is coupled through input capacitor Cin, integrator 102 receives an input signal in the form of an input charge packet Qin. Input charge packet Qin is the charge that is transferred through capacitor Cin due to the voltage change at voltage Vin. When the amplitude of the step input voltage Vin is expressed as $\Delta V_{in}$, the transferred charge is given by:

$$Q_{in} = C_{in} \Delta V_{in},$$

where the charge Qin is transferred through Cin to ground. The ratio of charge flow per unit time defines a current. The ADC input current $I_{in}$ which flows through capacitor $C_{in}$ every cycle time T can be defined as:

$$I_{in} = \frac{Q_{in}}{T} = \frac{C_{in} \Delta V_{in}}{T},$$

where T is the period of the repetitive activation of switch S1, equivalent to the period of signal Clk1 in system 100. In modulator 101, the charge Qin is transferred through Cin to node 110 which is a virtual ground node of amplifier 112. Note that in the present illustration, input charge packet Qin is shown as flowing from node 104 to node 110 (also referred to as a positive charge packet). The direction of flow for input charge packet Qin is a function of the polarity of step input voltage Vin that is sampled and used to generate input charge packet Qin. Specifically, when the positive-going transition of voltage Vin is sampled, input charge packet Qin flows into node 110 of integrator 102 and a "positive" charge packet results. However, if the control signals of system 100 were modified so that a negative-going transition of voltage Vin is sampled, input charge packet Qin would flow out of node 110 of integrator 102 and a "negative" charge packet results. In the present embodiment, charge balancing modulator 101 determines the value of the step input voltage Vin by balancing a positive input charge packet with a negative reference charge packet, as will be explained in more detail below. In other embodiments, a negative input charge packet can be used as long as the polarity of the reference charge packet and the polarity of either the analog signals (integ_out or integ_out_neg) or of the digital signals (digital_out and digital_out_bar) or the switch control signals (data_dep and data_dep_bar) are modified accordingly.

Amplifier 112 of integrator 102 also receives a reference signal in the form of a reference charge packet Qdac at the inverting input terminal (node 110). As discussed above, reference signal generator 108 includes resistor $R_{ref}$ switchably connected to current source 105 through switch S2. Resistor $R_{ref}$ is excited by excitation current $I_s$ by the switching action of switch S2 under the control of clock Clk3. A voltage step Vdac is generated at node 109 as a result of the switched current excitation flowing through resistor $R_{ref}$. Voltage step Vdac is AC coupled through a capacitor Cref to the inverting input terminal (node 110) of amplifier 112. The charge transferred through capacitor Cref can be expressed as:

$$Q_{dac} = C_{ref} \Delta V_{dac},$$

where voltage $\Delta V_{dac}$, is the magnitude of the step change of voltage Vdac at node 109 due to the switched excitation of current $I_s$. Specifically, in the present embodiment, $\Delta V_{dac}$ is equal to $(R_{ref} * I_s)$. The ratio of charge flow per unit time defines a current. The current $I_{ref}$ supplied by the reference signal generator per modulator cycle time T can be defined as:

$$I_{ref} = \frac{Q_{dac}}{T} = \frac{C_{ref} R_{ref} I_S}{T},$$

where T is the period of the repetitive activations of switch S2, equivalent to the period of signal clock Clk3 in system 100. The current $I_{ref}$ defines the maximum ADC input current which can be successfully balanced. An input current $I_{in}$ with the same magnitude as $I_{ref}$ is the fullscale input current of the ADC.

In the present embodiment, reference charge packet Qdac is a negative charge packet because the negative-going transitions of voltage step Vdac are used to generate the charge packet. Therefore, reference charge packet Qdac is shown in FIG. 1 as flowing out of node 110 into node 109. Reference charge packet Qdac can be a positive charge packet if the positive-going transitions of voltage step Vdac are used to generate the charge packet. As explained above, the polarity of reference charge packet Qdac is opposite the polarity of the input charge packet Qin to implement charge balancing in modulator 101. Furthermore, the magnitude of reference charge packet Qdac is indicative of the full range of resistance measurement desired for digitizing ohmmeter system 100. That is, during normal operation, input charge packet Qin will always be as large as or smaller than reference charge packet Qdac.

Integrator 102 of modulator 101 includes capacitor Caccum switchably connected across amplifier 112 for storing the charge packets provided at input node 110. Specifically, one plate of capacitor Caccum is connected to the inverting input terminal (node 110) of amplifier 112 while the other plate of capacitor Caccum is connected to the output terminal (node 116) of amplifier 112 through a switch S4. Switch S4 is controlled by the inverse of the data dependent signal (Data_dep_bar). When switch S4 is closed, capacitor Caccum is connected in the negative feedback loop of amplifier 112 and integrator 102 is in an active mode. When switch S4 is open, capacitor Caccum is disconnected from amplifier 112 and integrator 102 is in an inactive mode whereby the voltage across and the charge stored on capacitor Caccum are not affected by the operation of amplifier 112. As will become apparent in the description below, switch S3 and switch S4, controlled by Data_dep signal and its inverse respectively, operate in a complementary fashion (one switch closes while another opens) such that integrator 102 is either active (amplifier 112 connected to capacitor Caccum by action of switch S4) or inactive (amplifier 112 shorted by action of switch S3). As a result, capacitor Caccum integrates or discards the charge packets present at input node 110, depending on the state of the Data_dep signal.

The operation of modulator 101 will be described in brief here. Based on the control of clock signals Clk1 and Clk2, where the active portion of clock Clk2 is always passed through to the Data_dep signal and thence to switch S3, integrator 102 uses gated continuous time integration to accumulate charge from the input charge packet Qin. Then, integrator 102 receives a periodic, non-data dependent reference charge packet from reference signal generator 108 which reference charge packet Qdac is used, in a data dependant manner, to balance the charge accumulated due to the input voltage step Vin. Clock signal Clk3 controls the timing of the application of the reference charge packet Qdac to the inverting input terminal (node 110) of amplifier 112. Specifically, in modulator 101, reference signal generator 108 always supplies a charge packet. However, integrator 102 is reconfigured by the operation of switches S3 and S4 in a data dependent manner so as to either allow the accumulation of the "bucking" reference charge packet at capacitor Caccum or to keep the amplifier in an inactive (or autozero) mode and ignore the applied "bucking" reference charge packet. For a detailed description of the operational characteristics of modulator 101, refer to aforementioned patent application entitled "Low Noise Correlated Double Sampling Modulation System".

In operation, when step input voltage Vin makes a positive-going transition from the ground potential to $\Delta V_{in}$, a positive charge packet Qin is generated. The closed loop amplifier circuit through amplifier 112 and capacitor Caccum forces the input charge Qin to be accumulated at Caccum. If the charge at capacitor Caccum increases above a certain threshold level, integrator 102 removes the charge on capacitor Caccum by the amount of the reference charge packet. If the charge at capacitor Caccum is below the threshold level, then integrator 102 keeps the replacing charge on capacitor Caccum due to the positive input charge packet Qin. Thus, over several sampling cycles, capacitor Caccum holds the running difference between the sum of the input charge packets Qin and the sum of the reference charge packets Qdac that have been applied.

Returning to FIG. 1, the output voltage integ_out of integrator 102 (at node 114) is coupled to an inverting gain buffer 118. Buffer 118 is used to present a high impedance input to capacitor Caccum such that no loading is placed on capacitor Caccum. In the present embodiment, buffer 118 has a gain of −K. Thus, the output voltage integ_out_neg from buffer 118 is equal to −K times the input voltage integ_out. In one embodiment, buffer 118 can have a gain of −1 whereby the buffer operates to merely invert the voltage polarity of the input voltage.

After buffer 118, the voltage integ_out_neg is coupled to a comparator 120 comparing the voltage integ_out_neg with a reference voltage $V_{Ref1}$. In the present embodiment, reference voltage $V_{Ref1}$ is a ground voltage. If the integ_out_neg value is greater than $V_{Ref1}$, comparator 120 generates a logical "1" as the output signal. If the integ_out_neg value is less then $V_{Ref1}$, comparator 120 generates a logical "0" as the output signal. Comparator 120 is controlled by clock signal Clk1 such that comparisons are triggered on the rising edge of clock signal Clk1 and the comparator outputs Q and $\overline{Q}$ are valid for at least the duration of clock signal Clk1. In one embodiment, voltage $V_{Ref1}$ is the logical threshold level of the inverter gate in the comparator.

It is instructive to note that the output signal of integrator 102 is taken from the right plate of capacitor Caccum and not from the output terminal of amplifier 112 as is done in conventional modulators. This construction provides several advantages. First, the integrator output signal integ_out is continuously connected to the subsequently circuitry without the use of intervening switches. Thus, the integ_out signal remains valid even if the integrator is in an inactive mode. For example, the integ_out signal can be used by the subsequent analog stages even during the time interval when the integrator amplifier is in a correlated double sampling mode. Using the valid signal during the correlated double sampling time can reduce the number of clock phases required for the modulator operation and make possible pipelined implementation of modulator 101. A second advantage concerns kT/C noise generated by the opening of switch S4. Because the output signal is taken from a point inside the feedback loop formed by amplifier 112, switch S4 and capacitor Caccum, the error charge generated by the opening of switch S4 is forced by the loop gain to partially be absorbed by the amplifier output circuits. Thus the output signal integ_out at node 114 exhibits diminished kT/C noise error compared to architectures where capacitor Caccum is switched using conventional switched capacitor techniques.

The output signal digital_out from comparator 120 is a single bit digital data stream on terminal 121 which digital data stream is provided to digital post processing circuit 134 for filtering and determining the digital value thereof. In the present embodiment, the digital_out signal has an average ones density that is proportional to the average amplitude of the input voltage step Vin due to the switched current excitation over the time period examined.

Modulator 101 includes a logic circuit 123 for implementing data dependent charge accumulation at integrator 102. That is, reference charge packets are continuously generated at reference signal generator 108 but the modulation system determines whether to accumulate the charges at capacitor Caccum in a data dependent manner. Specifically, the inverse of the digital_out signal (digital_out_bar), on terminal 122, is coupled to logic circuit 123 which generates the data dependent Data_dep signal (on node 130) and its inverse Data_dep_bar (on node 132). Data_dep signal is coupled to control switch S3 and Data_dep_bar signal is coupled to control switch S4 of integrator 102. In this manner, integrator 102 is activated or deactivated based on the data dependent signal and its inverse. As a result, the reference charge packet Qdac is accumulated or ignored by the action of switches S3 and S4.

Logic circuit 123 is controlled by a clock signal Clk4 and is activated on the rising edge of clock Clk4 for generating the Data_dep and Data_dep_bar signals. Logic circuit 123 also receives a clock signal Clk2 which controls integrator 102 for performing correlated double sampling, as will be described in more detail below. In the present embodiment, logic circuit 123 includes an AND logic gate 124 receiving the digital_out_bar signal and clock Clk4. The output of the AND gate is coupled to an OR logic gate 126 which also receives clock Clk2 as input. The output of OR gate 126 is the Data_dep signal. An inverter 128 is used to generate the inverse signal Data_dep_bar. Note that FIG. 1 merely illustrates one embodiment of logic circuit 123 and one of ordinary skill in the art would appreciate that logic circuit 123 can be implemented in other manners using other combination of logic gates to generate the same data dependent signals.

In operation, during the charge balancing phase, when the voltage integ_out at the output node 114 is zero or a negative voltage, signal integ_out_neg is at a zero or positive voltage and comparator 120 generates a logical hi value ("1") as digital_out. The inverse of digital_out on line 122 is thus a logical low value. Accordingly, Data_dep_bar signal on node 132 is asserted and switch S4 is closed to activate the integrator. The reference charge packet Qdac from the reference signal generator circuit is thus accumulated at capacitor Caccum (which has the effect of increasing the voltage integ_out). Alternately, when the voltage integ_out at the output node 114 is a positive voltage, comparator 120 generates a logical low value ("0") as digital_out. The inverse of digital_out on line 122 is thus a logical hi value. Accordingly, Data_dep signal on node 130 is asserted and switch S3 is closed to short out (or deactivate) the integrator. As a result, the reference charge packet Qdac from reference signal generator 108 is not accumulated and is dissipated by the amplifier output circuits. In this manner, modulator 101 accumulates the charge from the reference charge packet in a data dependent manner.

As mentioned above, modulator 101 employs correlated double sampling (CDS) to cancel the amplifier DC offset voltage, 1/f noise and wideband amplifier noise. Specifically, during the CDS phase of the sampling cycle activated by clock signal Clk2, integrator 102 is shorted out and capacitor Caccum is disconnected from the amplifier. Any offset voltage, input 1/f noise and wideband voltage noise, collectively referred to as "the amplifier error voltage", at the input terminals of amplifier 112 also appear at the output terminal (node 116) of amplifier 112. Due to the short-circuited connection at amplifier 112, the voltages at the right plate of capacitor Cin and at the right plate of capacitor Cref are thus charged to the amplifier error voltage. In this manner, the amplifier error voltage is stored on capacitors Cin and Cref and is cancelled out at amplifier 112 during the subsequent input acquisition phase and during the subsequent data dependant Qdac charge accumulations. Thus, a highly precise output voltage can be generated at amplifier 112, free of offset errors and amplifier noise.

As described above, the ADC circuit of digitizing ohmmeter system 100 is a charge balancing ADC where the modulator uses the reference charge packets to cancel the accumulated input charge. The number of times that the input charge must be balanced is often the digital parameter of interest as it corresponds to a quantized estimate of the average applied analog input signal step Vin. In the present embodiment, the input voltage step Vin is directly proportional to the resistance of the sensor $R_{ext}$ and the digital parameter of interest is the sensed resistance of resistive element $R_{ext}$. Thus, modulator 101 of digitizing ohmmeter system 100 is operated repeatedly over a large number of sampling cycles to generate a series of digital bit decisions that form a ones density data stream as the digital_out signal.

Figure 2:
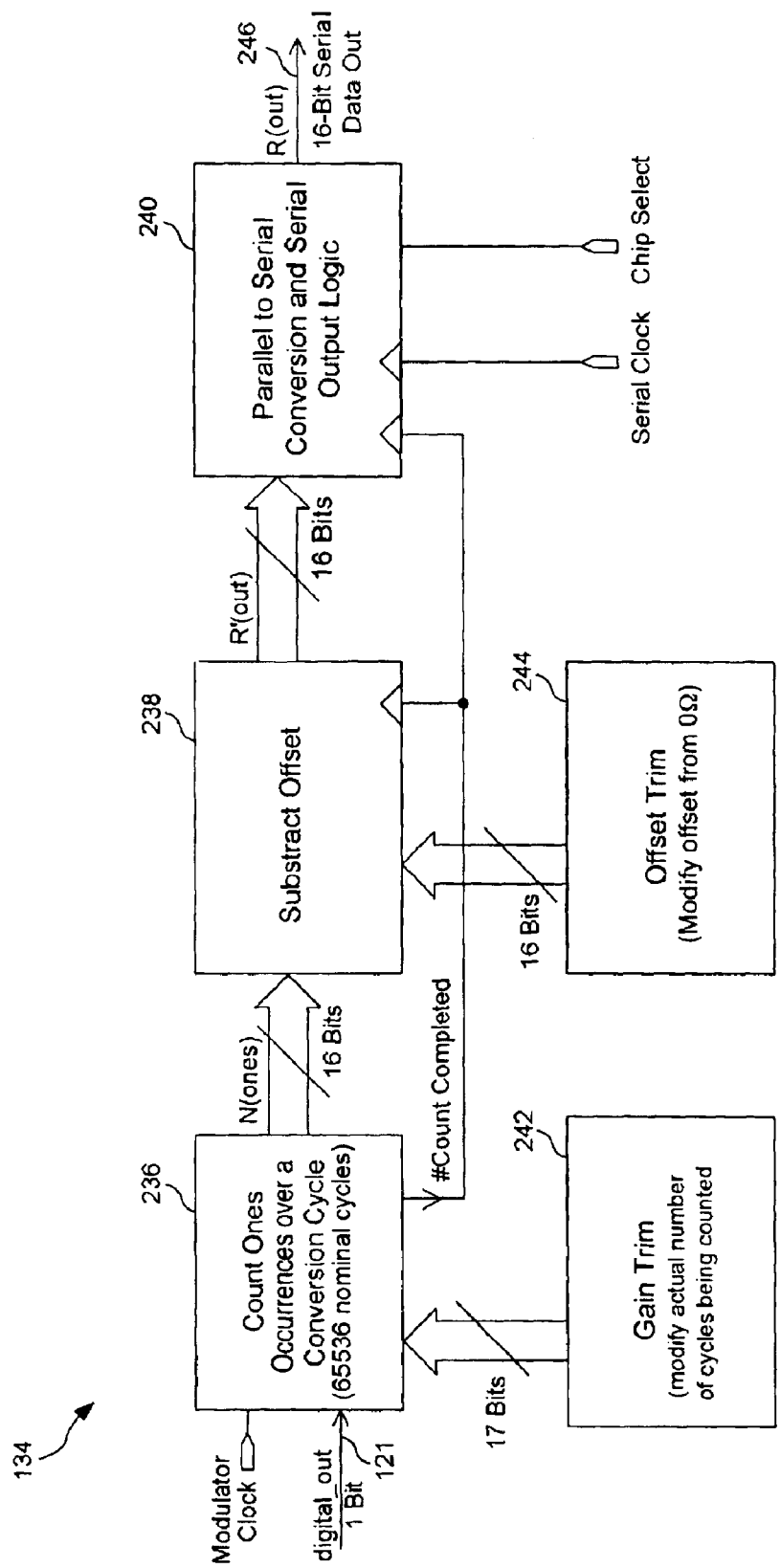
FIG. 2 is a block diagram of a digital post processing circuit which can be incorporated in the digitizing ohmmeter system of FIG. 1 according to one embodiment of the present invention.

Referring to FIG. 1, the digital_out signal from modulator 101 is coupled to digital post processing circuit 134 for digital processing. FIG. 2 is a block diagram of a digital post processing circuit which can be incorporated in digitizing ohmmeter system 100 according to one embodiment of the present invention. In the present embodiment, digital post processing circuit 134 is illustrated as providing a 16-bit digital output word as the resistance output signal R(out). Furthermore, in the present embodiment, digital post processing circuit 134 is illustrated as providing a serial data output. The 16-bit serial data output from circuit 134 is illustrative only. One of ordinary skill in the art would appreciate that digital post processing circuit 134 can be configured to generate a resistance output signal having the desired precision in either serial or parallel data format.

Referring to FIG. 2, circuit 134 includes a block 236 for counting the number of ones occurrences in digital_out signal over a conversion period, a block 238 for offset subtraction and a block 240 for converting the resistance output signal from parallel data format into serial data format. In the present embodiment, digital post processing circuit 134 further includes a block 242 for providing digital gain trim and a block 244 for providing offset trim.

Specifically, block 236 is coupled to receive the digital_out signal on bus 121 from modulator 101 and also to receive a modulator clock signal. To form a single 16 bit word of 16 bit precision from digital_out which is an one-bit data stream, it is necessary to count the number of "ones" present in $2^{16}$ or 65536 one-bit samples of the data stream. The counting function of block 236 can be combined with the required gain adjust functionality provided by block 242 to make the actual number of samples accumulated programmable. For instance, for digitizing ohmmeter systems whose input gain is too low, not enough "ones" would be present in 65536 samples to accumulate to the desired number. Thus, such a resistance measurement unit would be digitally trimmed to count for slightly more than 65536 samples for each conversion. Similarly, for digitizing ohmmeter systems whose gain from the input is slightly high, the unit would count too many "ones" in 65536 samples. Such unit can be digitally trimmed to count slightly less than 65536 samples. Block 236 generates an accumulated count number N(ones) of 16 bits indicative of the sensed resistance of resistor $R_{ext}$.

A consequence of constructing a composite digital number from the addition of a large number of identically weighted samples is that the composite number so formed averages the effect of any wideband random noise over the set of samples added. The accumulation of 65536 samples corresponds to a finite impulse response digital lowpass filter described by 65536 unity-weighted coefficients. The lowpass filter characteristic of this stage of digital post processing filters out the effects of noise above roughly 1 part in 32768 of the ones density frequency, thereby greatly reducing the amount of noise within the final output numbers. In other embodiments, other decimating lowpass digital filters can be used to reduce noise level even more. However, the use of high performance decimating lowpass digital filters may increase the design complexity of the filters.

Imperfections in digitizing ohmmeter system 100 may result in small offset errors, potentially of random sign. These offset errors can be digitally corrected by applying a digital offset trim within a properly selected trim range. Block 244 of digital post processing circuit 134 provides a programmable digital offset which is subtracted from the accumulated count number N(ones) to correct for all offsets. Block 238 generates a resistance output value R'(out) in 16-bit parallel format.

Finally, when serial output data is desired, resistance output value is provided to block 240 to convert the 16-bit parallel data format to serial data format, under the control of a user-generated serial clock. The serial clock is used to serially clock the resistance output signal R(out) onto a data output line 246 which can be a data output pin of digitizing ohmmeter system 100. As mentioned above, block 240 is optional and is required only when serial output data is desired.

System Operation

Figure 3:
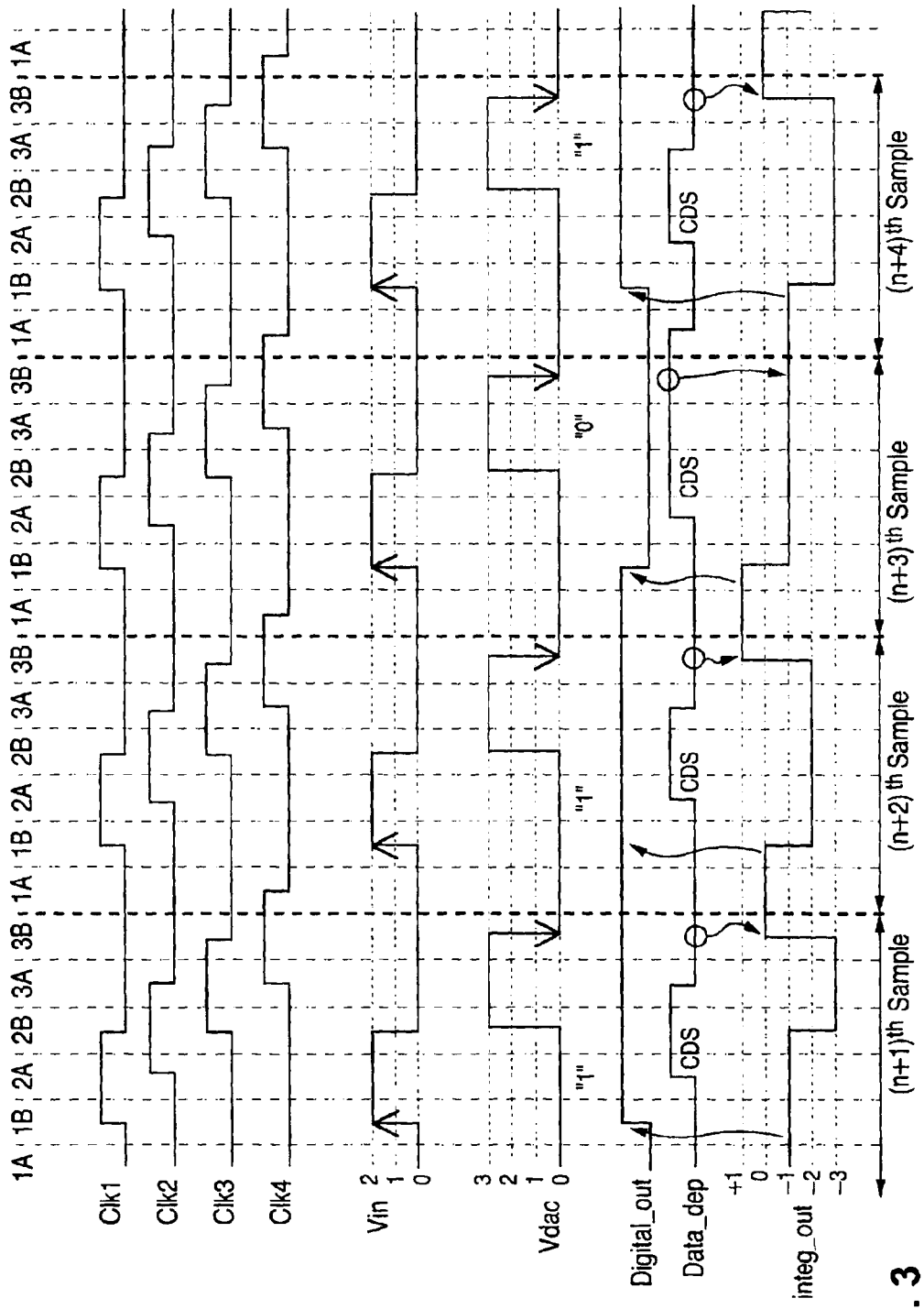
FIG. 3 illustrates one representative clocking scheme under which the digitizing ohmmeter system of the present invention can be operated.

The operation of digitizing ohmmeter system 100 will now be described with reference to the timing diagram of FIG. 3. FIG. 3 illustrates one representative clocking scheme under which the digitizing ohmmeter system of the present invention can be operated. Of course, one of ordinary skill in the art would appreciate that other clocking schemes can also be used to operate the digitizing ohmmeter system of the present invention to achieve low noise, high precision resistance measurements.

Referring to FIG. 3, the clock signal waveforms and the corresponding values for the digital_out signal, the Data_dep signal and the integ_out signal are shown for four representative samples during a conversion of the repeated step input voltage Vin. The embodiment of digitizing ohmmeter system 100 of FIG. 1 implements a first order incremental ADC, and a single conversion to obtain q-bit digital output data requires $2^q$ samples of the input voltage step. For example, to convert an analog value into a 16-bit digital output data will require 65,536 samples in a single conversion. In the present embodiment, it is assumed that the amplitude of the input voltage step Vin does not change or changes very slowly during the time of a single conversion so that dynamic measurement errors can be ignored. In one embodiment of the present invention, a conversion time of 200 ms is required to obtain digital data of 16 bit precision and a conversion time of 12.5 ms is required to obtain digital data of 12 bit precision. Therefore, as long as the sensed input condition is not changing rapidly with respect to the conversion time period, the above assumption will hold.

FIG. 3 illustrates the timing and signal waveforms for the $(n+1)^{th}$ to $(n+4)^{th}$ samples of a conversion of the resistance of resistor $R_{ext}$ in digitizing ohmmeter system 100 of the present invention. The initialization of system 100 and the initial conditions of the various nodes of the system are not shown in FIG. 3. In one embodiment, when system 100 implements an incremental ADC, a switch is coupled across capacitor Caccum to short out capacitor Caccum before each conversion to remove any charge stored thereon. However, the shorting of capacitor Caccum in an incremental ADC implementation between conversions is optional as any residual charge on the capacitor will only result in small measurement errors.

Each sampling cycle of system 100 can be viewed as consisting of three phases: an input sampling and charge integration phase, a CDS phase and a data dependent charge balancing phase. Referring to FIG. 3, timing intervals 1A, 1B, 2A, 2B, 3A, and 3B are provided to denote the A and B portions of each of the three phases of the sampling cycle. Furthermore, signal integ_out as illustrated in FIG. 3 is a voltage signal used to indicate the amount of charge stored on capacitor Caccum. Capacitor Caccum is located within the negative feedback path of inverting amplifier 112. Because the inverting amplifier will force the left plate of capacitor Caccum at the inverting input terminal (node 110) to virtual ground, the integ_out voltage signal at the right plate of capacitor Caccum (or the integrator output node 114) is given as:

$$V_{integ\_out} = -\frac{Q_{accum}}{C_{accum}}.$$

In FIG. 3, the vertical scale of the integ_out signal is divided into slices demarcating separate voltage units which voltage unit is a measurement unit used in the present description to quantify the charge stored or the charge transferred in system 100. The voltage units are defined solely to show the voltage change due to integration of one unit charge, where said unit charge will be used in the description of the operation of system 100. To facilitate the description of the operation of the digitizing ohmmeter system of the present invention, an artificial zero volt reference value for the integ_out signal can be assumed to correspond to a voltage unit level between the third voltage unit and the fifth voltage unit. Similarly, voltage steps Vin and Vdac are expressed in FIG. 3 in terms of voltage units.

At the $n^{th}$ sampling cycle, system 100 has generated a digital_out value of "0". At the end of the $n^{th}$ sampling cycle, capacitor Caccum has stored thereon one unit of charge as a result of the charge integration and charge balancing phases during the $n^{th}$ sampling cycle. The voltage of integ_out signal at output node 114 of inverting amplifier 112 is therefore at minus one (−1) voltage unit.

At the beginning of the $(n+1)^{th}$ sampling cycle (interval 1A), the input voltage Vin is stable at a low voltage level. Clock CLK4 is deasserted and all clock signals are at a low logical level. Switches S1, S2 and S3 are open while switch S4 is closed as a result. Integrator 102 of modulator 101 is therefore in an active mode and the sampling and charge integration phase has begun. Then, at interval 1B, clock Clk1 is asserted (goes high). Since clock Clk1 controls the switched excitation current circuit as well as comparator 120, two events take place at the rising edge of clock Clk1.

First, comparator 120 is interrogated and the digital_out value for the previous sample is read out. Because integ_out has a value of minus one (−1) voltage unit, inverting gain buffer 118 converts integ_out signal to integ_out_neg signal having a relatively positive voltage level (such as +K voltage units, when K=1, integ_out neg signal is about +1 voltage unit). At comparator 120, the integ_out_neg signal is compared with reference voltage $V_{Ref1}$ which is assumed to be at zero volt in the present embodiment. Because the integ_out_neg signal is greater than $V_{Ref1}$, comparator 120 generates a logical high value as the digital_out "Q" output. Thus, the digital_out signal switches to a logical "1" value during interval 1B in response to clock Clk1.

Second, switch S1 is closed in response to the rising edge of clock Clk1 and resistor $R_{ext}$ is excited by the application of switched current $I_s$ from current source 105. In response to the switched current excitation, input voltage Vin steps from a first voltage value to a second, higher voltage value. The change in voltage Vin (ΔVin) is AC coupled through capacitor Cin to the inverting input terminal of amplifier 112. Because it is assumed that the input voltage step persists for a long time as compared to the input circuit time constants, all the charge collected at the left plate of capacitor Cin associated with ΔVin is transferred to the right plate of capacitor Cin.

Specifically, the charge coupled through capacitor Cin is given by:

$$Q_{in}=C_{in}\Delta V_{in}$$

where ΔVin is the change in input voltage Vin due to the synchronous switched current excitation and Cin is the value of capacitor Cin.

Because integrator 102 is in the active mode, amplifier 112 forces the inverting input terminal (node 110) to a virtual ground. Therefore, the charge coupled through capacitor Cin is directed to capacitor Caccum. Because amplifier 112 is configured in an inverting mode, the increase in charge stored in capacitor Caccum causes a decrease in the voltage at the integ_out node (node 114) proportional to the magnitude of the charge Qin to be accumulated:

$$\Delta V_{integ\_out} = -\frac{\Delta Q_{accum}}{C_{accum}} = -\frac{Q_{in}}{C_{accum}} = -\Delta V_{in}\frac{C_{in}}{C_{accum}}$$

where Qaccum is the charge accumulated at capacitor Caccum, and Caccum represents the capacitance of capacitor Caccum.

In the present embodiment, capacitor Cin and capacitor Caccum have the same capacitance value. In one embodiment, the capacitance of capacitor Cin and of capacitor Caccum is each 2pF. In the present illustration, it is assumed that the rising edge of Vin causes two additional charge units to be stored in capacitor Caccum and thus the integ_out signal decreases by two voltage units to a level of minus three (−3) voltage units.

Because integrator 102 is active during the entire interval 1B, that is, the integrator is active before, during and after the Vin rising edge, continuous time integration of the input voltage step signal is realized. The use of continuous time integration to sample the input analog voltage has the effect of low pass filtering the input signal and thereby filters out any wideband noise that may present on the input signal.

After sampling and integrating the charge associated with the rising edge of input voltage Vin, the charge integration phase of the sampling cycle has completed and system 100 begins performing correlated double sampling (CDS) (time intervals 2A and 2B) for the next sampling cycle. In the present timing scheme, precharging the input capacitor with the amplifier error voltage from amplifier 112 is controlled by clock Clk2 and is always performed in one sampling cycle for the next sampling cycle. Thus, during time interval 2A, clock Clk2 is asserted. As a result, OR gate 126 of logic circuit 123 generates a logical "hi" value on output node 130. Thus, Data_dep signal switches to a logical "hi" value and Data_dep_bar switches to a logical "low" value correspondingly. Accordingly, switch S3 is closed and switch S4 is open and integrator 102 is made inactive.

As a result of closing switch S3, amplifier 112 is shorted out and integrator 102 is inactive. Therefore, any amplifier error voltage, such as those due to DC offset voltage and 1/f noise, appears on the amplifier output terminal. Input capacitor Cin and reference capacitor Cref are thereby precharged with the amplifier error voltage so that, at the next sampling cycle and at the next data dependant charge accumulation, the amplifier error voltage is cancelled out during the sampling and charge integration phase. In this manner, correlated double sampling of the system is effectuated.

In the present embodiment, when clock Clk2 is asserted, integrator 102 is forced to be inactive. Therefore, clock Clk2 can be used advantageously to block the sampling of undesired signal transitions. For instance, when clock Clk1 is deasserted, switch S1 is open and input voltage Vin switches back to a low voltage value. The high-to-low transition of input voltage Vin should not be accumulated by integrator 102 as the high-to-low transition will cancel out the charge previously accumulated at the low-to-high transition. Therefore, in the present timing scheme, clock Clk1 is deasserted during the active cycle of clock Clk2 (interval 2B). Thus, the falling edge of input voltage step Vin is ignored by system 100 and no charge from the Vin falling edge is accumulated.

Furthermore, to implement charge balancing in system 100, a negative charge packet is applied to integrator 102 at each sampling cycle to balance out the positive charge accumulated from the ΔVin voltage. In FIG. 3, voltage waveform Vdac represents the voltage used to generate the reference charge packet Qdac. In the present embodiment, to effectuate charge balancing, only the negative charge packet associated with the falling edge of voltage Vdac is used. Thus, in accordance with the present timing scheme, the positive-going transition of voltage Vdac is applied during the active cycle of clock Clk2 while integrator 102 is deactivated so that the positive charge packet associated with the rising edge of voltage Vdac is ignored. In system 100, clock Clk3 controls reference signal generator 108 for generating a charge packet on node 110. Thus, voltage Vdac is synchronous with clock Clk3. Referring to FIG. 3, clock Clk3 is asserted during the active cycle of clock Clk2 (interval 2B) such that the rising edge of voltage Vdac (the positive charge packet) occurs during the integrator inactive period.

As a result of deasserting clock Clk1 and asserting clock Clk3 during the active period of clock Clk2 (interval 2B), the accumulated charge on capacitor Caccum due to the rising edge of input voltage Vin is preserved and the charge associated with the rising edge of voltage Vdac is ignored. The system is now ready to begin the data dependent charge balancing phase.

During interval 3A, clock Clk2 is deasserted while clock Clk4 is asserted. Thus, integrator 102 is no longer forced in the inactive mode but instead the integrator is either active or inactive depending upon the value of the digital_out signal and consequently the Data_dep signal. The assertion of clock Clk4 activates the data dependent charge balancing phase of the sampling cycle. During the charge balancing phase, the system determines in a data dependent manner whether to accumulate or disregard the negative reference charge packet to be generated by the falling edge of voltage Vdac.

AND gate 124 of logic circuit 123 receives as input signals clock Clk4 and the inverse of the digital_out signal ($\overline{Q}$). When clock Clk4 is asserted, the output of AND gate 124 will have the same value as the digital_out_bar signal ($\overline{Q}$). The output of OR gate 126 is also the same as the output of AND gate 124 as the other input of OR gate 126 (clock Clk2) is deasserted. Thus, logic circuit 123 generates a Data_dep signal which is the inverse of the digital_out signal. In the present illustration, digital_out has a value of "1" and thus Data_dep transitions to a low logical value when clock Clk4 is asserted.

When Data_dep has a logical value of "0", switch S3 is open and switch S4, controlled by Data_dep_bar, is closed. Thus, integrator 102 is activated. During interval 3B, clock Clk3 is deasserted and voltage Vdac makes a high-to-low transition. The negative charge associated with the falling edge of voltage Vdac is thus accumulated by integrator 102. As shown in FIG. 3, the integ_out value increases by three voltage units, from −3 to 0, as a result of accumulating the negative reference charge packet (the reference charge packet is assumed to be of minus three (−3) charge units). Note that because integrator 102 is activated during intervals 3A and 3B, that is before, during and after the falling edge of the reference charge packet, the integrator implements continuous time integration which effectuates a low-pass filter function for filtering any wideband noise on the reference charge packet signal.

At the end of the charge balancing phase, capacitor Caccum has accumulated charged based on the change in input voltage ΔVin and based on the reference charge packet, in a data dependent manner. During the (n+1)$^{th}$ sampling cycle the accumulated charge has increased by two units and decreased by three, resulting in a held charge of zero charge units at capacitor Caccum and a voltage at integ_out of zero voltage units. The system then proceeds to the next sampling cycle by deasserting clock CLK4 and asserting clock Clk1.

During the (n+2)$^{th}$ sampling cycle, system 100 operates in the same manner as described above. When the charge associated with the positive step ΔVin voltage, having two charge units, is accumulated, the charge at capacitor Caccum increases by 2 charge units and the voltage at the integ_out node (node 114) decreases to −2 voltage units. Because comparator 120 continues to read an integ_out_neg value that is greater than $V_{Ref1}$, digital_out remains at a logical "1" value. Thus, during the data dependent charge balancing phase, the negative reference charge packet is accumulated by capacitor Caccum and Qaccum decreases by three charge units, with a corresponding increase in the voltage at integ_out of 3 voltage units. A sum of negative one charge unit is stored on capacitor Caccum at the end of the (n+2)$^{th}$ sampling cycle, and the voltage at integ_out is at plus one (+1) voltage unit.

At the (n+3)$^{th}$ sampling cycle, integ_out signal has a voltage level that exceeds the artificial zero volt reference level. Thus, the integ_out_neg signal becomes a negative voltage value or a voltage value less than $V_{Ref1}$. Thus, comparator 120 generates a logical "0" as output and digital_out transitions to a logical "0" value as shown in FIG. 3. When the ΔVin voltage, having two positive charge units, is accumulated, the charge at capacitor Caccum changes from negative 1 to positive 1 charge unit and integ_out signal decreases to minus one voltage unit.

As a result of digital_out being at a logical "0" value, the Data_dep signal remains at a logical "1" value when the charge balancing phase (interval 3A) is initiated. The state of the Data_dep signal causes switch S3 to close and switch S4 to open. Thus, integrator 102 is deactivated and capacitor Caccum is prevented from accumulating any charge from the falling edge of the reference charge packet (interval 3B). Integ_out thus remains at the minus one voltage unit level at the end of the (n+3)$^{th}$ sampling cycle.

As shown by the operation of sampling cycles (n+1) to (n+3), digitizing ohmmeter system 100 implements data dependent charge balancing and the charge associated with the falling edge of voltage Vdac, which is used to generate the reference charge packet Qdac, is either accumulated or ignored depending on the value of the digital_out signal. The sample cycles are repeated until a large enough number of the digital bit decisions have been made so that the residual quantization error of the digitizing process is below certain desired application specific limits.

In sum, in the present embodiment, digitizing ohmmeter system 100 implements charge balancing by sampling only the rising edge of the input voltage step Vin and accumulating, in a data dependent manner, only reference charge packets generated by the falling edge of voltage Vdac. Because integrator 102 is an inverting integrator, the integ_out signal decreases due to the rising edge of Vin and increases due to the negative reference charge packet.

As a result of adding and subtracting the charge due to the ΔVin voltage and the charge from the reference charge packet, the digitizing ohmmeter system generates a digital_out signal in the form of a ones density data stream. The single bit output data stream generated by comparator 120 will exhibit a ones density proportional to the amplitude of the change in input voltage ΔVin. Specifically, under the assumption that the step size Δvin does not change appreciably over a single conversion, the average ones density is given as:

$$OnesDensity = \Delta V_{in} \frac{C_{in}}{C_{ref} V_{dac}} = \frac{Q_{in}}{Q_{dac}},$$

where Qdac denotes the amount of charge in the reference charge packet. The ones density value is always less than or equal to 1 as Qin is always less than or equal to Qdac. For example, in the present illustration, the ΔVin voltage step generates an input charge Qin that has a charge unit level that is ⅔ of the reference charge packet Qdac. Thus, a ones density data stream containing 66.7% ones and 33.3% zeroes is generated. After completing a conversion of the input voltage value, the ones density pulse stream can be processed by the subsequent digital processing circuitry to determine the digital value thereof.

Specifically, referring to FIG. 2, the ones density data stream is coupled to block 236 for counting the number of occurrences of ones over the conversion period. Then the count value, which indicates a resistance measurement, is converted to a resistance output value by subtracting an offset trim, if any, in block 238. The resistance output value R(out) can then be provided as a digital output in a serial format by block 240. As described above, gain and offset trims can be applied to correct for offset errors and to improve the accuracy of the resistance output value.

Operation Theory

In the implementation shown in FIG. 1, digitizing ohmmeter system is made to digitize the ratio of the resistance of an external resistor ($R_{ext}$) to the resistance of a local reference resistor ($R_{ref}$). The operation of the digitizing ohmmeter system can be described mathematically by the equations below:

$$\Delta V_{in} = I_S R_{ext};$$

$$Q_{in} = C_{in}\Delta V_{in} = C_{in}I_S R_{ext};$$

$$I_{in} = \frac{Q_{in}}{T} = \frac{I_S R_{ext} C_{in}}{T}; \text{ and}$$

$$I_{ref} = \frac{I_S R_{ref} C_{ref}}{T},$$

where:
$I_{in}$=ADC input current in Amperes;
$I_s$=not-necessarily-precise excitation current in Amperes;
$R_{ext}$=resistance to be measured in Ohms;
$C_{in}$=input capacitor value in Farads;
T=sample period in seconds;
$I_{ref}$=ADC fullscale DAC current in Amperes;
$R_{ref}$=ADC reference resistance in Ohms; and
$C_{ref}$=ADC reference capacitor in Farads.

The average ones density at the system digitized output, $D_{out}$ is given by:

$$D_{out} = \frac{I_{in}}{I_{ref}} = \frac{R_{ext}C_{in}}{R_{ref}C_{ref}}.$$

The final digital value is obtained by digitally processing the one-bit ones density data stream, usually by counting the number of "ones" over a fixed number of cycles N. This digital number ranges from zero (for $R_{ext}$ near 0 Ohms) to N (for $R_{ext}$ equal to or greater than $R_{ref}$). FIG. 2 shows an implementation of a digital post processing circuit where N is assumed to be 65536 to yield output numbers of 16 bit precision.

From the equation for $D_{out}$ above, the digital output value depends upon the capacitance ratio Cin/Cref, which can be made a very stable and predictable constant, and the ratio of the resistors $R_{ext}/R_{ref}$. Errors in the value of the reference resistor or in the capacitance ratio produce only gain errors which can be eliminated by a one-time trim, either by trimming the reference resistor value or by storing digital gain correction in EPROM.

Alternate Embodiments

In the present embodiment, the digitizing ohmmeter system accumulates charge on the rising edge of input voltage step Vin and on the falling edge of the reference charge packet. However, this implementation scheme is illustrative only and one of ordinary skill in the art would appreciate that the digitizing ohmmeter system of the present invention can be operated using other clocking schemes. For instance, the digitizing ohmmeter system can be made to accumulate charge on the falling edge of input voltage step Vin and on the rising edge of the reference charge packet. In that case, because the modulator uses an inverting amplifier, the integ_out signal does not need to be inverted before being compared with the reference voltage $V_{Ref1}$. Thus, inverting gain buffer 118 between capacitor Caccum and comparator 120 can be eliminated or a non-inverting buffer amplifier may be utilized.

Figure 4:
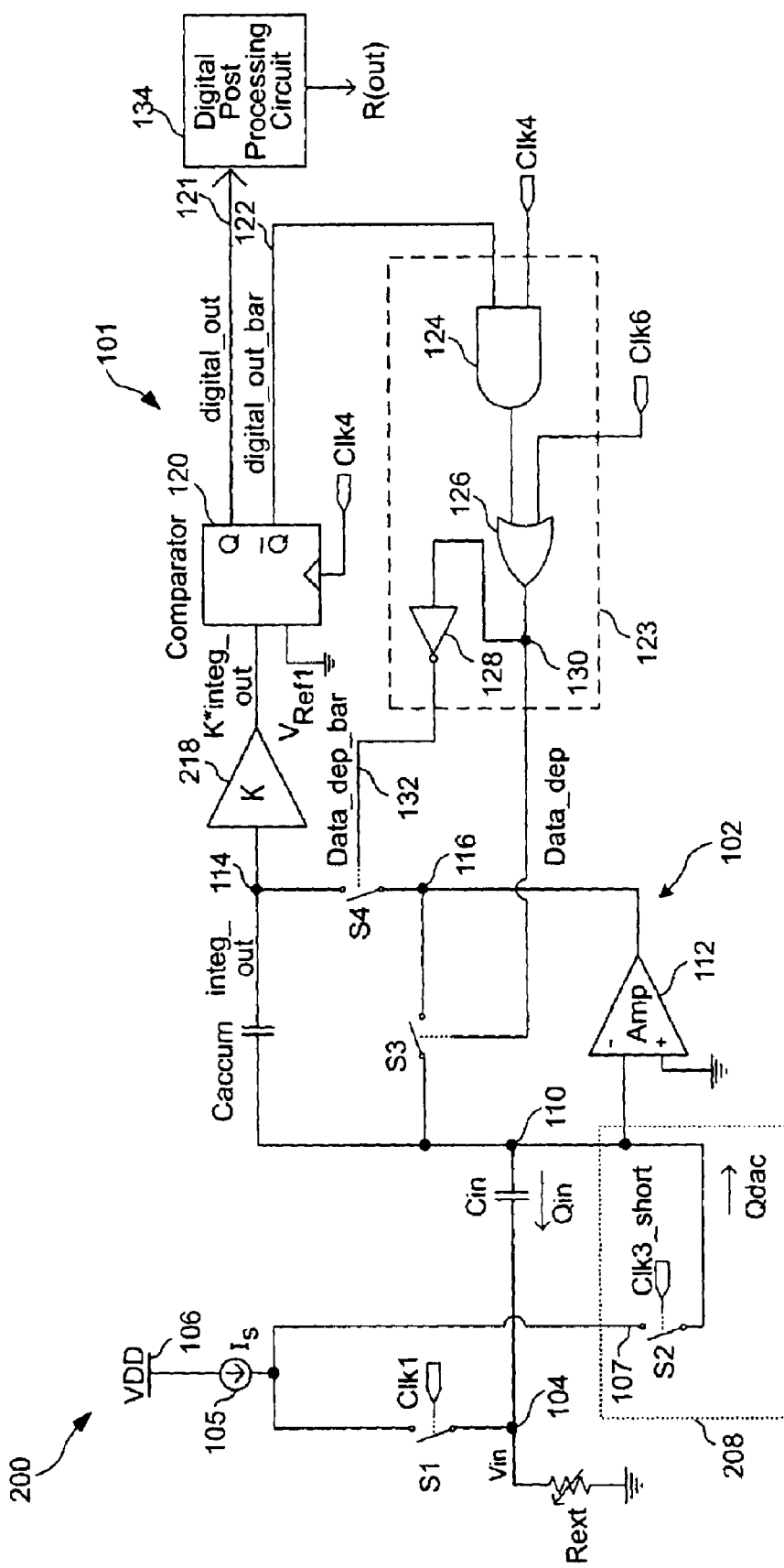
FIG. 4 is a schematic diagram of a digitizing ohmmeter system according to an alternate embodiment of the present invention.

In digitizing ohmmeter system 100 of FIG. 1, a reference resistor $R_{ref}$ is used to establish the fullscale resistance range that can be measured. In an alternate embodiment of the present invention, the reference resistor is eliminated and the reference current $I_{ref}$ is established by controlling precisely the time during which the excitation current $I_s$ is applied within each modulator cycle. FIG. 4 is a schematic diagram of a digitizing ohmmeter system according to an alternate embodiment of the present invention. Like elements in FIGS. 1 and 4 are given like reference numerals to simplify discussion.

Referring to FIG. 4, digitizing ohmmeter system 200 includes a reference signal generator 208 for applying current $I_{ref}$ directly to the inverting input terminal of amplifier 112 to function as the reference charge packet Qdac. In reference signal generator 208, the current $I_{ref}$ is generated by applying excitation current $I_s$ through a switch for a precise and short amount of time. In the present embodiment, a switch S2, controlled by a stable clock signal Clk3_short, regulates the application of excitation current Is. The pulse width of clock Clk3_short should be a known constant time which is typically a small fraction of the length of time of the clock pulse of clock Clk1. By periodically closing switch S2 for a small amount of time and thereby gating "on" the excitation current $I_s$ for a short, precise amount of time, a reference current $I_{ref}$ in the form of a reference charge packet Qdac every T seconds is generated and provided to the inverting input terminal of amplifier 112 directly. Digital timing generators for generating a stable clock frequency and pulse width as clock Clk3_short are well known in the art. In one embodiment, the digital timing generator operates from a crystal controlled master clock and includes digital logic to define a small, precise time interval $t_{on}$ based upon the precise crystal clock frequency. For example, clock Clk3_short can be generated by minor modifications to the same digital logic circuits which provide the other clocks in system 200, provided that the logic circuits are clocked by a higher frequency master clock than was required in the previous embodiment. In this manner, a fullscale reference current $I_{ref}$ is generated in digitizing ohmmeter system 200 without the use of a reference resistor.

Note that in the embodiment of digitizing ohmmeter system 200 shown in FIG. 4, a non-inverting gain buffer 218 is coupled between capacitor Caccum and comparator 120. The non-inverting gain buffer 218 is used in this embodiment because system 200 is to be operated using the timing scheme of FIG. 5 where the digitizing ohmmeter system accumulate charge on the falling edge of the input voltage step (negative input charge packet) and balance the input charge using charge from the rising edge of the resistance reference signal (positive reference charge packet). As explained above, in this configuration, the integ_out signal does not need to be inverted before being compared with the reference voltage $V_{Ref1}$. When amplification or buffering of the integ_out signal is not needed, buffer 218 can be omitted entirely and integ_out signal can be coupled directly to the input terminal of comparator 120. In other embodiments, digitizing ohmmeter system 200 can be operated using other timing schemes and an inverting gain buffer may be included between capacitor Caccum and comparator 120.

The operation of digitizing ohmmeter system 200 in the embodiment shown in FIG. 4 can be described mathematically by the equations below:

$$I_{in} = \frac{I_S R_{ext} C_{in}}{T}; \text{ and}$$

$$I_{ref} = \frac{I_S t_{on}}{T},$$

where:
$I_{in}$=ADC input current in Amperes;
$I_s$=not-necessarily-precise excitation current in Amperes;

$R_{ext}$=resistance to be measured in Ohms;
$C_{in}$=input capacitor value in Farads;
T=sample period in seconds;
$I_{ref}$=ADC fullscale DAC current in Amperes; and
$t_{on}$=time that current $I_S$ is gated "on" in seconds.

The average ones density at the system digitized output, $D_{out}$ is given by:

$$D_{out} = \frac{I_{in}}{I_{ref}} = \frac{R_{ext}C_{in}}{t_{on}}, \text{ for}$$

$$0 \le R_{ext} < \frac{t_{on}}{C_{in}}.$$

From the equation for $D_{out}$ above, the digital output value depends upon the absolute capacitance value of capacitor Cin, which is in general a stable constant, and the absolute time of the interval $t_{on}$, which can be made very stable through the use of a stable frequency source and digital logic. Small errors in the value of the input capacitor Cin produce only small gain errors which can be eliminated by a one-time trim, either by trimming the capacitor value or by storing digital gain correction in EPROM. Drift in the value of $C_{in}$ due to temperature or aging and any change in the value $t_{on}$ due to temperature or supply voltage variations will limit the absolute accuracy of the system under such conditions. In one embodiment $t_{on}$ is chosen to be 100 nanoseconds, $C_{in}$ is chosen to be 2 pico-Farads and the system measures resistances between 0 and 50,000 Ohms.

Figure 5:
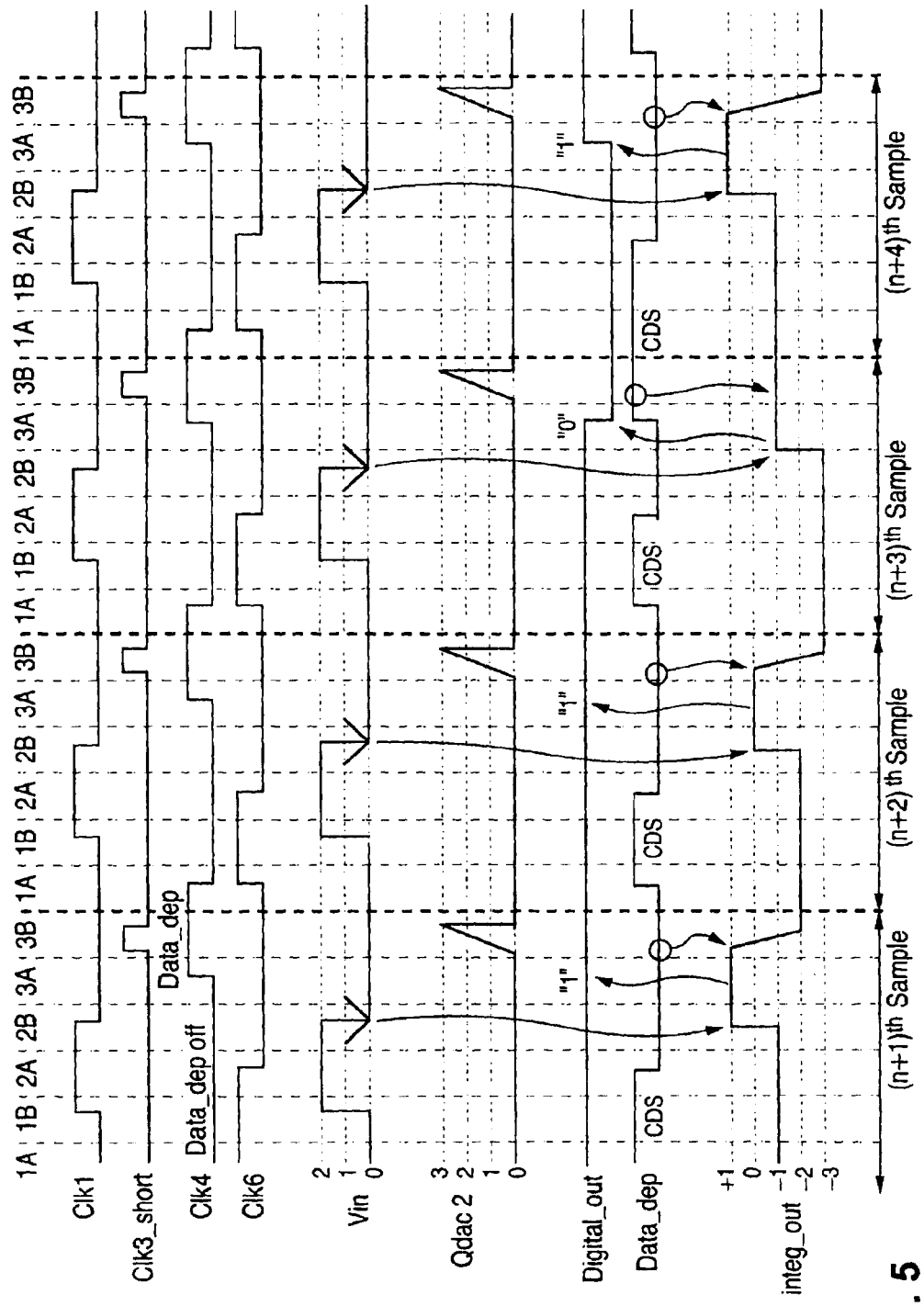
FIG. 5 illustrates one representative clocking scheme under which the digitizing ohmmeter system of FIG. 4 can be operated.

In one embodiment, digitizing ohmmeter system 200 is operated using the timing scheme in FIG. 5. When digitizing ohmmeter system 200 is operated using the timing scheme shown in FIG. 5, digitizing ohmmeter system 200 integrate charge associated with the falling edge of input voltage step Vin and balanced the input charge with a bucking charge from a positive charge packet generated by current $I_{ref}$. The operation of digitizing ohmmeter system 200 under the timing scheme of FIG. 5 is analogous to the operation of digitizing ohmmeter system 100 under the timing scheme of FIG. 3 and will be described in brief below.

Referring to FIG. 5, each sampling cycle of system 200 consists of three phases: a CDS phase (intervals 1A and 1B), an input sampling and charge integration phase (intervals 2A and 2B) and a data dependent charge balancing phase (intervals 3A and 3B). In digitizing ohmmeter system 200, clock Clk6 controls the CDS operation of the system. Clock Clk1 controls the application of the excitation current $I_s$ to input sensor $R_{ext}$ while clock Clk3_short controls the application of the reference charge packet Qdac to integrator 102. Finally, clock Clk4 controls the data dependent charge balancing operation of system 200 by gating on the generation of the Data_dep and Data_dep_bar signals based on the digital_out value.

At the $n^{th}$ sampling cycle, system 200 has generated a digital_out value of "0". At the end of the $n^{th}$ sampling cycle, capacitor Caccum has stored thereon one units of charge as a result of the charge integration and charge balancing phases during the $n^{th}$ sampling cycle. The voltage of integ_out signal at output node 114 of inverting amplifier 112 is therefore at minus one (−1) voltage unit.

At the beginning of the $(n+1)^{th}$ sampling cycle (interval 1A), the input voltage Vin is stable at a low voltage level. During interval 1A, clock Clk4 is deasserted while clock Clk6 is asserted to initiate the correlated double sampling operation for the current sampling cycle. As a result of clock Clk6 being at a logical "hi" value, Data_dep signal is asserted (logical hi) to close switch S3 while Data_dep_bar signal is deasserted (logical low) to open switch S4. Integrator 102 is thus shorted out and is in an inactive mode. Therefore, any amplifier error voltage, such as those due to DC offset voltage and 1/f noise, appears on the amplifier output terminal. Input capacitor Cin is thereby precharged with the amplifier error voltage so that the amplifier error voltage is cancelled out during the sampling and charge integration phase to follow. In this manner, correlated double sampling of the modulator is effectuated. While clock Clk6 is asserted, clock Clk1 is asserted (interval 1B) so that input sensor $R_{ext}$ us excited by the application of current $I_s$ and input voltage step Vin switches from low to high. The charge associated with the low to high transition of Vin is not integrated as integrator 102 is deactivated.

During interval 2A, clock Clk6 is deasserted. When both clocks Clk6 and Clk4 are deasserted, system 200 is put in a non-data dependent input accumulation mode. That is, Data_dep signal is at a logical low value and Data_dep_bar is at a logical hi value. Thus, switch S3 is open while switch S4 is closed. As a result, integrator 102 is activated.

During interval 2B, clock Clk1 is deasserted. Switch S1 is opened in response to the falling edge of clock Clk1. The excitation current $I_s$ driving input sensor $R_{ext}$ is removed and input voltage step Vin makes a negative-going transition from a high to a low voltage level. The magnitude of the voltage change ΔVin is indicative of the sensed resistance of input sensor $R_{ext}$. The voltage change ΔVin is AC coupled through capacitor Cin to the inverting input terminal (node 110) of amplifier 112. The charge coupled through capacitor Cin is given by:

$$Q_{in} = C_{in} \Delta V_{in}$$

where ΔVin is the change in input voltage Vin due to the synchronous switched current excitation and Cin is the value of the capacitor Cin. In the present embodiment, input charge packet Qin is associated with the falling edge of voltage Vin and thus is a negative charge packet.

When the negative input charge packet Qin in integrated by amplifier 112, an increase in voltage at the integ_out node of capacitor Caccum results. This is because amplifier 112 is configured in an inverting mode such that the decrease in charge stored in capacitor Caccum due to negative charge packet Qin causes an increase in the voltage at integ_out proportional to the magnitude of the accumulated charge Qin:

$$\Delta V_{integ\_out} = -\frac{\Delta Q_{accum}}{C_{accum}} = -\frac{Q_{in}}{C_{accum}} = -\Delta V_{in} \frac{C_{in}}{C_{accum}}$$

where Qaccum is the charge accumulated at capacitor Caccum, and Caccum represents the capacitance of capacitor Caccum. Note that in the present embodiment, voltage Vin has a negative-going transition. Thus, the change in voltage ΔVin has a negative polarity such that $\Delta V_{integ\_out}$ has a positive polarity.

In the present illustration, it is assumed that the falling edge of Vin causes two additional charge units to be removed from capacitor Caccum and thus the integ_out signal increases by two voltage units to a level of positive one (+1) voltage unit.

Next, at interval 3A, clock Clk4 is asserted which initiates the data dependent charge balancing phase of the sample cycle. Integrator 102 is no longer forced in the active or inactive mode but instead is controlled by the value of the digital_out signal. During the charge balancing phase, modulator 101 determines in a data dependent manner whether to accumulate or disregard the positive reference charge packet Qdac due to the clock pulse Clk3_short.

Because comparator 120 is also controlled by clock Clk4, comparator 120 is interrogated on the rising edge of clock Clk4 and the digital_out value for the current sample cycle is read out of integrator 102. Because integ_out signal has a value of positive one (+1) voltage unit, the integ_out signal is compared with reference voltage $V_{Ref1}$ at comparator 120 which is assumed to be at zero volt in the present embodiment. Because the integ_out signal is greater than voltage $V_{Ref1}$, comparator 120 generates a logical hi value as the digital_out "Q" output. Thus, the digital_out signal has a valid output value of logical "1" during the time that clock Clk4 is asserted.

The digital_out signal generated by comparator 120 determines whether the subsequently generated reference charge packet will be accumulated in capacitor Caccum or discarded. When digital_out has a value of logical "1", Data_dep signal has a logical low value. Thus, switch S3 is open while switch S4 is closed and integrator 102 is in an active mode. Accordingly, the reference charge packet will be accumulated. When digital_out has a value of logical "0", Data_dep signal has a logical hi value. Thus, switch S3 is closed while switch S4 is open and integrator 102 is in an inactive mode. Accordingly, the reference charge packet will not be accumulated.

In the present illustration, Data_dep has a logical value of "0" and integrator 102 is activated to integrate charge associated with the positive reference charge packet Qdac. As shown in FIG. 5, the integ_out value decreases by three voltage units, from +1 to −2, as a result of accumulating the positive reference charge packet (the reference charge packet is assumed to be of three (3) charge units).

At the end of the charge balancing phase, capacitor Caccum has accumulated charged based on the change in input voltage ΔVin and based on the reference charge packet, in a data dependent manner. During the $(n+_1)^{th}$ sampling cycle the accumulated charge has decreased by two units and increased by three, resulting in a held charge of two charge units at capacitor Caccum and a voltage at integ_out of minus two (−2) voltage units. The digitizing ohmmeter system then proceeds to the next sampling cycle by deasserting clock Clk4 and asserting clock Clk6.

During the $(n+2)^{th}$ sampling cycle, digitizing ohmmeter system 200 operates in the same manner as described above. When the charge associated with the negative-going step ΔVin voltage, having minus two (−2) charge units, is accumulated, the charge at capacitor Caccum decreases by 2 charge units and the voltage at integ_out (node 114) increases to 0 voltage units. Because comparator 120 now acts upon an integ_out value (0 voltage units) that is equal to or greater than voltage $V_{Ref1}$ (0 voltage units), digital_out remains at a logical "1" value at the rising edge of clock Clk4. As a result of digital_out being at a logical "1" value, the Data_dep signal switches to a logical "0" value during the charge balancing phase (intervals 3A/3B) and the charge associated with the reference charge packet Qdac is accumulated. Integ_out signal decreases by three voltage units, from 0 to −3.

At the $(n+_3)^{th}$ sampling cycle, the charge associated with the negative-going step $ΔV_{in}$ voltage, having minus two (−2) charge units, is accumulated. The charge at capacitor Caccum decreases by 2 charge units and the voltage at integ_out (node 114) increases to −1 voltage unit. Because comparator 120 now read an integ_out value (−1 voltage unit) that is smaller than voltage $V_{Ref1}$ (0 voltage units), digital_out switches to a logical "0" value at the rising edge of clock Clk4. As a result of digital_out being at a logical "0" value, the Data_dep signal switches to a logical "1" value during the charge balancing phase (intervals 3A/3B). The state of the Data_dep signal causes switch S3 to close and switch S4 to open. Thus, integrator 102 is deactivated and capacitor Caccum is prevented from accumulating any charge from the rising edge of the reference charge packet Qdac. Integ_out signal thus remains at the minus one (−1) voltage unit at the end of the $(n+3)^{th}$ sampling cycle.

As shown by the operation of sampling cycles (n+1) to (n+3) in FIG. 5, digitizing ohmmeter system 200 implements data dependent charge balancing and the charge associated with the positive reference charge packet Qdac is either accumulated or ignored depending on the value of the digital_out signal. The sample cycles are repeated until a large enough number of the digital bit decisions has been made so that the residual quantization error of the digitizing process is below certain desired application specific limits.

In sum, in the present embodiment, digitizing ohmmeter system 200 implements charge balancing by sampling only the falling edge of the input voltage step Vin and accumulating, in a data dependent manner, only the positive reference charge packets generated by gating excitation current $I_s$ on for a short, precise amount of time. Because integrator 102 is an inverting integrator, the integ_out signal increases due to the falling edge of Vin and decreases due to the positive reference charge packet.

As described in the above embodiments, the digitizing ohmmeter system of the present invention can be operated using a reference resistor or using a short, precise time interval to generate the fullscale reference current. Furthermore, the digitizing ohmmeter system of the present invention can be operated by integrating the rising or falling edge of the input voltage step Vin and balancing the charge with a reference charge packet having the opposite polarity to the polarity of the input charge packet.

In the above descriptions, amplifier 112 is implemented as an operational amplifier where the non-inverting input terminal is connected to the ground potential. In an alternate embodiment, the amplifier can be implemented as a two terminal self-referential inverting transconductance amplifier (referred to herein as a gmIC). An amplifier capable of operating at very low voltage levels with uncompromised or even improved performances in transconductance is described in commonly assigned U.S. Pat. No. 6,147,550, entitled "Method And Apparatus For Reliably Determining Subthreshold Current Densities In Transconductance Cells," of Peter R. Holloway, issued Nov. 14, 2000; and also in commonly assigned U.S. Pat. No. 5,936,433, entitled "Comparator Including A Transconducting Inverter Biased To Operate In Subthreshold," of Peter R. Holloway, issued Aug. 10, 1999. Both of the aforementioned patents are incorporated herein by reference in their entireties. Thus, in the alternate embodiment, amplifier 112 is implemented based on the transconductance inverting cell technology described in the aforementioned patents and amplifier 112 is self-referencing. Therefore, amplifier 112 includes only one input terminal coupled to node 110 and no reference voltage input terminal is needed.

Furthermore, in another alternate embodiment, comparator 120 can also be implemented as a transconductance amplifier (gmIC) described above. Because a gmIC is a self-referential amplifier, comparator 120 will not require a separate reference voltage $V_{Ref1}$. When amplifier 112 or comparator 120 is implemented as a gmIC, the digitizing ohmmeter system of the present invention can be operated with a very low noise level even at minimal supply voltage because gmIC amplifiers are designed to run at a constant current density over temperature.

Switches S3 and S4 in modulator 101 are composed of MOS transistors and are typically controlled by non-overlapping digital signals. When any MOS switch is turned from on to off, its stored channel charge will be shared by the capacitors and circuit elements connected to both its analog input and its analog output terminals. This charge sharing condition is often referred to as charge feed-through. This channel charge is an additive error because it does not originate from the input analog signals but is generated from within the switches when they are switched off.

In one embodiment, the switches in modulator 101 can be implemented using any conventional switch circuits. According to an alternate embodiment of the present invention, switches S3 and S4 of modulator 101 are implemented as "boosted" switches to reduce charge feed-through that may occur when the switches are being turned on or off. A self-bootstrapping constant on-resistance switch circuit is described in copending and commonly assigned U.S. patent application Ser. No. 10/402,080, entitled "A Constant $R_{ON}$ Switch Circuit with Low Distortion and Reduction of Pedestal Errors," of Peter R. Holloway, filed Mar. 27, 2003, which patent application is incorporated herein by reference in its entirety. When the low distortion boosted switch circuit described in the aforementioned patent application is used to implement switches S3 and S4, errors resulting from channel charge feed-through during the switching of the switches are significantly reduced and excellent measurement accuracy can be realized in the digitizing ohmmeter system of the present invention, which accuracy cannot be readily realized in conventional resistance measurement systems.

Furthermore, in another embodiment of the present invention, switch S3 and switch S4 are scaled to ensure that the net charge error accumulated in capacitor Caccum during each sampling cycle is nearly zero. Specifically, because switch S3 and switch S4 are connected to different nodes within the modulator circuit, the feed-through charge error generated by equally-sized switches does not result in a zero net charge error across capacitor Caccum. It is known that the channel charge error generated within a switch is proportional to its gate area. By scaling the ratio of the gate areas of switches S3 and S4 appropriately, the amount of charge error can be applied to both sides of capacitor Caccum, first by one switch and then by the other, which results in a net charge error of nearly zero being held in capacitor Caccum at the end of each sampling cycle.

In one embodiment, the digitizing ohmmeter system of the present invention, including the variable resistive element $R_{ext}$ and the digital post processing circuit, is integrated onto a single integrated circuit. In other embodiments, the variable resistive element $R_{ext}$ can be an input sensor external to the integrated circuit on which the digitizing ohmmeter system is formed. In that case, the excitation current $I_s$ is provided to resistor $R_{ext}$ through external pins on the digitizing ohmmeter system. In yet another embodiment, the digital post processing circuit of the digitizing ohmmeter system may be formed on an integrated circuit separate from the digitizing ohmmeter system. In general, the digitizing ohmmeter system of the present invention can be fabricated using various degree of integration, as is well understood by one skilled in the art.

System Characteristics and Advantages

The digitizing ohmmeter system of the present invention provides many advantages over conventional resistance measurement systems.

First, in the digitizing ohmmeter system of the present invention, the same excitation current $I_s$ time shared between the input sensor and the reference signal generator. Thus, the digitizing ohmmeter system of the present invention realizes full ratiometric operation in which slow changes or errors in the excitation current will affect both the input signal and the reference signal equally. As a result, the digitizing ohmmeter system of the present invention does not require a precision current or voltage reference to obtain highly accurate resistance measurements. The system can be operated with a one-time calibration to obtain gain and offset trim values which trim values are applied to the digitizing ohmmeter system to adjust the digitizing operations. In this manner, the digitizing ohmmeter system of the present invention provides highly accurate resistance measurements without requiring a precision current or voltage source.

Second, the digitizing ohmmeter system of the present invention utilizes the novel low noise CDS modulator described in aforementioned U.S. patent application Ser. No. 10/401,835, entitled "Low Noise Correlated Double Sampling Modulation System," of Peter R. Holloway et al. The modulator operates as a synchronous integrator in the ADC circuit. The use of the novel low noise CDS modulator provides further benefits in achieving low noise and high accuracy operations.

Third, in the digitizing ohmmeter system of the present invention, both the analog input signal and the reference signal are AC coupled to the ADC circuit. Because of the non-switched AC coupled connection between the input sensor (resistor $R_{ext}$) and the input to the Synchronous Integrator (node 110), charge packets continuously flow back and forth between the input sensor and the integrator input node. With no switch in the circuit path, the dreaded switched capacitor kT/C noise is completely avoided. In sum, the digitizing ohmmeter system of the present invention incorporates AC coupling of the input signal and the reference signal for reduction of switched capacitor noise and novel output steering circuitry to synchronously rectify the AC coupled charge packet, thereby allowing for charge balancing operation with minimal or no alteration of the input topology.

Fourth, the synchronous integrator (modulator 101) implements correlated double sampling at both inputs (Vin and Vdac) to the integrator to cancel out offset voltages and 1/f nose. In fact, the amount of CDS low frequency noise cancellation is significant. For instance, the reduction of noise signals in the 5 Hertz range is on the order of 100,000X. Therefore, the digitizing ohmmeter system of the present invention is capable of achieving very low noise operation.

The above detailed descriptions are provided to illustrate specific embodiments of the present invention and are not intended to be limiting. Numerous modifications and variations within the scope of the present invention are possible. The present invention is defined by the appended claims.

We claim:

1. A digitizing ohmmeter system comprising:
   a switched excitation circuit coupled to excite an impedance-varying input sensor for generating an input voltage step indicative of the resistance of said input sensor; and
   an analog-to-digital converter (ADC) circuit coupled to sample said input voltage step and generate a resistance output signal, said ADC circuit comprising:
     a modulator coupled to integrate charge associated with said input voltage step and balance said charge with charge associated with a fullscale resistance reference signal, said modulator generating a digital output signal, said digital output signal forming a digital data stream over a plurality of sampling cycles where said digital data stream has an ones density proportional to the ratio of the resistance of said input sensor to said fullscale resistance reference signal; and post processing circuit coupled to receive said digital data stream and generating a digital number indicative of the occurrence of ones in said digital data stream within said plurality of sampling cycles as said resistance output signal.

2. The digitizing ohmmeter system of claim 1, wherein said input voltage step is AC coupled to said modulator of said ADC circuit.

3. The digitizing ohmmeter system of claim 1, wherein said fullscale resistance reference signal comprises a reference charge packet and wherein said modulator applies said reference charge packet to balance said charge associated with said input voltage step based on a data dependent signal, said data dependent signal having a value corresponding to said digital output signal of said modulator.

4. The digitizing ohmmeter system of claim 3, wherein said modulator comprises:

an integrator coupled to sample said input voltage step synchronously with the excitation of said input sensor and to generate an integrator output signal, said integrator comprising:
  an input capacitor having a first terminal coupled to said input sensor and a second terminal;
  an amplifier having a first input terminal coupled to said second terminal of said input capacitor and an output terminal, said input voltage step being AC coupled through said input capacitor to said first input terminal of said amplifier;
  an accumulation capacitor having a first terminal coupled to said first input terminal of said amplifier and a second terminal providing said integrator output signal;
  a first switch coupled between said first input terminal and said output terminal of said amplifier, said first switch being controlled by said data dependent signal; and
  a second switch coupled between said second terminal of said accumulation capacitor and said output terminal of said amplifier, said second switch being controlled by an inverse of said data dependent signal;

a reference signal generator generating said reference charge packet as said fullscale resistance reference signal; and a comparator having an input terminal coupled to receive a signal corresponding to said integrator output signal and comparing said signal to a reference level, said comparator generating said digital output signal at an output terminal.

5. The digitizing ohmmeter system of claim 4, wherein said reference signal generator comprises:
  a third switch coupled between said switched excitation circuit and a first node;
  a reference resistor coupled between said first node and a first supply voltage; and
  a reference capacitor coupled between said first node and said first input terminal of said amplifier,
  wherein said switched excitation circuit provides an excitation current and said third switch is controlled by a first clock signal to provide said excitation current to said reference resistor to generate said fullscale resistance reference signal, said fullscale resistance reference signal being AC coupled to said integrator through said reference capacitor to generate said reference charge packet.

6. The digitizing ohmmeter system of claim 4, wherein said reference signal generator comprises:
  a third switch coupled between said switched excitation circuit and said first input terminal of said amplifier, said third switch being controlled by a first clock signal,
  wherein said switched excitation circuit provides an excitation current, said excitation current being applied to said input sensor for a first time interval; and wherein said first clock signal is applied for a second time interval to close said third switch so that a portion of said excitation current $I_s$ provided through said third switch to said integrator as said fullscale resistance reference signal in the form of said reference charge packet, said second time interval being a small fraction of said first time interval.

7. The digitizing ohmmeter system of claim 4, wherein said first switch is closed and said second switch is open to operate said integrator in a correlated double sampling mode for enabling said amplifier to store an amplifier error voltage onto said input capacitor.

8. The digitizing ohmmeter system of claim 7, wherein said amplifier error voltage comprises an amplifier offset voltage, 1/f noise and wideband amplifier noise.

9. The digitizing ohmmeter system of claim 4, further comprising:
  a logic circuit for generating said data dependent signal and said inverse, said logic circuit receiving an input signal corresponding to said digital output signal and a first clock signal,
  wherein said first clock signal is asserted to cause said data dependent signal to be at a first value for operating said integrator in said correlated double sampling mode.

10. The digitizing ohmmeter system of claim 4, wherein said integrator further comprises an inverting buffer having an input terminal coupled to said second terminal of said accumulation capacitor and an output terminal coupled to said input terminal of said comparator, said comparator receiving an input signal being an inverse of said integrator output signal.

11. The digitizing ohmmeter system of claim 4, wherein said amplifier comprises a self-referential transconductance amplifier.

12. The digitizing ohmmeter system of claim 4, wherein said comparator further comprises a second input terminal coupled to receive a reference voltage as said reference level.

13. The digitizing ohmmeter system of claim 4, wherein said comparator comprises a self-referential transconductance amplifier including one or more transconducting inverters.

14. The digitizing ohmmeter system of claim 4, wherein each of said first switch and said second switch comprises a self-bootstrapping constant on-resistance switch circuit.

15. The digitizing ohmmeter system of claim 4, wherein said integrator integrates charges associated with a rising edge of said input voltage step, and said data dependent signal directing said integrator to either integrate said reference charge packet associated with said falling edge of said fullscale resistance reference signal or disregard said reference charge packet.

16. The digitizing ohmmeter system of claim 4, wherein said integrator integrates charges associated with a falling edge of said input voltage step, and said data dependent signal directing said integrator to either integrate said reference charge packet associated with the rising edge of said fullscale resistance reference signal or disregard said reference charge packet.

17. The digitizing ohmmeter system of claim 1, wherein said post processing circuit comprises:
a counting circuit receiving said digital data stream and counting occurrences of ones in said digital data stream over a plurality of sampling cycles, said counting circuit generating a count value; and an offset subtraction circuit receiving said count value and subtracting from said count value an offset value to generate a resistance output value.

18. The digitizing ohmmeter system of claim 17, wherein a first trim value is applied to said counting circuit to adjust a total number of sampling cycles for which said occurrences of ones are counted, and a second trim value is applied to said offset subtraction circuit to adjust the value of said offset value.

* * * * *